United States Patent [19]

Tsuge et al.

[11] Patent Number: 4,670,762

[45] Date of Patent: Jun. 2, 1987

[54] AMORPHOUS SILICON SEMICONDUCTOR AND PROCESS FOR SAME

[75] Inventors: Kazunori Tsuge; Yoshihisa Tawada, both of Kobe; Yoshihiro Hamakawa, Kawanishi, all of Japan

[73] Assignee: Kanegafuchi Kagaku Kogyo Kabushiki Kaisha, Osaka, Japan

[21] Appl. No.: 751,410

[22] Filed: Jul. 3, 1985

Related U.S. Application Data

[62] Division of Ser. No. 578,939, Feb. 10, 1984, Pat. No. 4,544,423.

[51] Int. Cl.$^4$ .............................................. H01L 45/00
[52] U.S. Cl. ......................................... 357/2; 357/30; 357/58
[58] Field of Search ...................... 357/2, 30, 58, 30 B, 357/30 J, 30 K

[56]  References Cited

U.S. PATENT DOCUMENTS 4,177,474  12/1979  Ovshinsky ............................... 357/2
4,339,470   7/1982  Carlson ................................. 357/2 X Primary Examiner—Martin H. Edlow
Assistant Examiner—Sara W. Crane
Attorney, Agent, or Firm—Armstrong, Nikaido, Marmelstein & Kubovcik

[57] ABSTRACT

A process for preparing an amorphous silicon semiconductor comprising steps of plasma decomposing silicon compounds and carrying out photolysis of the silicon compounds. According to the process, a growth rate of the semiconductor is greatly increased. The obtained amorphous silicon semiconductor has excellent electrical and optical properties and is useful as a photovoltaic element.

8 Claims, No Drawings

AMORPHOUS SILICON SEMICONDUCTOR AND PROCESS FOR SAME

This is a division of application Ser. No. 578,939. filed Feb. 10, 1984, U.S. Pat. No. 4,544,423, issued 10-1-85.

BACKGROUND OF THE INVENTION

The present invention relates to an amorphous silicon semiconductor and a process for preparing the same.

With respect to an amorphous silicon prepared from silane ($SiH_4$) by plasma decomposition, since D. E. Carlson et al prepared a solar cell using an amorphous silicon semiconductor in 1976 on the basis of the discovery by W. E. Spear et al in 1976 that a conductivity of amorphous silicon is greatly varied by doping with $PH_3$ or $B_2H_6$, a solar cell using a thin film amorphous silicon has been given attention, and various studies for improving a conversion efficiency of the solar cell have been carried out.

Hitherto there have been proposed several types of photovoltaic elements using thin films of the amorphous silicon semiconductor such as Shottky barrier type, p-i-n junction type, MIS type and hereto junction type. Among them, the Schottky barrier type, p-i-n junction type and MIS type photovoltaic elements are useful as a solar cell having a high conversion efficiency. For instance, the Schottky barrier type solar cell has a conversion efficiency of 5.5% (D. E. Carlson et al "IEEE Trans. Electron Devices" EP-24, 449 (1977)), the MIS type solar cell has a conversion efficiency of 4.8% (J. I. B. Wilson et al "Nature" 272, 152(1978)) and the p-i-n junction type solar cell has a conversion efficiency of 4.5% (Yoshihiro Hamakawa et al "Surface Sci." 86, 486(1979)).

In a process for preparing the photovoltaic element, however, a growth rate of an i-layer is low, i.e. 1 to 2 A/sec, which prevents production of a low-cost element. For resolving the defect, various attempts have been made by changing reaction conditions. For instance, there has been proposed an attempt for increasing growth rate by increasing power in glow discharge. When the power is increased, however, properties of the prepared thin film amorphous silicon become bad because the influence of bombardment of the generated plasma increases (J. C. Knights, "Appl. Phys. Lett." 35(3), 244(1979)). There has also been proposed an attempt in which pressure is adjusted and an attempt in which the temperature of the substrate is varied. However, both attempts have defects that properties, particularly electrical properties, of the prepared amorphous silicon semiconductor become low level.

An object of the present invention is to provide a process for preparing an amorphous silicon semiconductor at an increased growth rate without impairing the properties of the semiconductor.

Another object of the present invention is to provide an amorphous silicon semiconductor having good electrical and optical properties.

SUMMARY OF THE INVENTION

According to the present invention, there is provided a process for preparing an amorphous silicon semiconductor comprising plasma decomposing silicon compounds and carrying out photolysis of the silicon compounds. According to the process, a growth rate of the semiconductor can be increased to a practical level. Also, in a process for preparing a p-type or n-type amorphous silicon semiconductor, efficiency of doping is considerably improved in the presence of light.

The amorphous silicon semiconductor prepared by the process of the present invention has excellent electrical and optical properties and is useful as a photovoltaic element.

DETAILED EXPLANATION OF THE INVENTION

In the process of the invention, the photolysis is carried out by radiating light to silicon compounds at the same time or before the plasma decomposition of the silicon compounds or to a mixed gas of silicon compounds and diluent gases.

The light to be radiated is light which can decompose the silicon compounds, preferably light having a wavelength of not more than 5000 Å, and having an intensity of not less than 20 $mW/cm^2$. When light having a wavelength of more than 5000 Å is used, photolysis of the silicon compound is hard to generate. When light having an intensity of less than 20 $mW/cm^2$ is used, the rate of the photolysis becomes too low to improve the growth rate of the amorphous silicon semiconductor. From a viewpoint of cost such as energy cost and a viewpoint of a material of a window through which the light passes, the wavelength and the intensity of the light are preferably not less than 700 Å and not more than 1000 $W/cm^2$, respectively.

The plasma decomposition of the silicon compound may be carried out according to a conventional method such as the C-coupled method or L-coupled method by means of high frequency glow discharge or dc glow discharge. As conditions of the glow discharge in the present invention, conventional conditions may be employed. For instance, conditions described in Japanese Unexamined Patent Publication Nos. 122471/1977 and 68681/1980 can be employed.

Typical examples of the silicon compound are, for instance, silane ($SiH_4$) and a derivative thereof, tetrafluorosilane ($SiF_4$) and a derivative thereof, and an admixture thereof. Typical examples of the diluent gas which is admixed with the silicon compound are, for instance, hydrogen gas, argon gas, helium gas, a hydrocarbon gas, a carbon fluoride gas, a gas of a compound including nitrogen and hydrogen or fluorine, and an admixture thereof. The concentration of the silicon compound in the mixed gas is usually not less than about 0.5% by mole. The silicon compound may also be employed alone.

According the present invention, an amorphous silicon semiconductor of an amorphous silicon, an amorphous silicon carbide, an amorphous silicon nitride or an admixture thereof can be prepared. When the amorphous silicon semiconductor is doped with an element of Group III of the Periodic Table a p-type amorphous silicon semiconductor can be prepared, and when the amorphous silicon semiconductor is doped with an element of Group V of the Periodic Table an n-type amorphous silicon compound can be prepared.

The process of the present invention can be applied to every preparation of the p-type, i-type and n-type semiconductors. Particularly, according to the process of the present invention, the efficiency of doping in the preparations of the p-type and n-type semiconductors can be increased and the growth rate increased without impairing the properties such as electrical properties of the semiconductor.

The amorphous silicon semiconductor prepared by the process of the present invention has excellent electrical and optical properties and is useful as an element for a solar cell, a photoswitch, a photosensor, and the like, or as a photosensitive material.

The present invention is more particularly explained by means of the following typical embodiments in which the amorphous silicon semiconductor is used as a photovoltaic element of a solar cell.

The amorphous silicon semiconductor of the present invention can be used as a photovoltaic element for any solar cell so far as an active layer is an intrinsic amorphous silicon semiconductor. Examples of the solar cell are, for instance, a solar cell to which sunlight is introduced from a p-layer, such as a solar cell having a construction of glass/transparent electrode/p-i-n type amorphous silicon semiconductor/aluminum; a solar cell to which sunlight is introduced from an n-layer, such as a solar cell having a construction of stainless steel/p-i-n type amorphous silicon semiconductor/transparent electrode; a solar cell having a thin layer of an insulator or a metal between the p-layer and the transparent electrode in the above solar cells; a Schottky barrier type solar cell; an MIS type solar cell; and the like.

As the substrate of the solar cell, every substrate used in conventional solar cells may be employed. Examples of the substrate are, for instance, a glass sheet, a polymer film or sheet, a metal sheet, and the like. Preferably, the transparent electrode is made of indium tin oxide (ITO) or $SnO_2$. The electrode may be formed by vacuum evaporation on a glass substrate or directly on the p-type or n-type amorphous silicon semiconductor.

A typical amorphous silicon semiconductor having a p-i-n structure consists of an i-layer of an intrinsic amorphous silicon semiconductor having a lifetime of carriers of not less than about $10^{-7}$ second, a localized state density of not more than about $10^{17}$ cm$^{-3}$.eV$^{-1}$ and a mobility of not less than about $10^{-3}$ cm$^2$/V.sec, a p-layer of an amorphous silicon semiconductor doped with an element of Group III of the Periodic Table and an n-layer of an amorphous silicon semiconductor doped with an element of Group V of the Periodic Table.

A typical construction of a solar cell including the p-i-n type semiconductor is a transparent electrode/p-type amorphous silicon semiconductor/i-type amorphous silicon semiconductor/n-type amorphous silicon semiconductor/electrode. Sunlight is introduced from the transparent electrode. A thickness of the p-layer is about 30 Å to about 300 Å, preferably about 50 Å to about 200 Å, and a thickness of the i-layer is about 2500 Å to about 10,000 Å. Since the n-layer is a layer for producing ohmic contact, a thickness of the n-layer is not particularly limited, and is preferably about 150 Å to about 600 Å.

Another typical construction of a solar cell including the p-i-n type semiconductor is a transparent electrode/n-type amorphous silicon semiconductor/i-type amorphous silicon semiconductor/p-type amorphous silicon semiconductor/electrode. Sunlight is introduced from the transparent electrode. Preferable thicknesses of the n-layer and the i-layer are about 30 Å to about 300 Å, particularly about 50 Å to about 200 Å and about 2500 Å to about 10,000 Å, respectively. A thickness of the p-layer is not particularly limited, and is preferably about 150 Å to about 600 Å.

The present invention is more particularly described and explained by means of the following Examples. It is to be understood that the present invention is not limited to the Examples and various changes and modifications may be made in the invention without departing from the spirit and scope thereof.

COMPARATIVE EXAMPLE

A reactor of 11 cm in inner diameter made of quartz was employed and glow discharge was carried out with a high frequency of 13.56 MHz.

In the above reaction conditions, an i-type amorphous silicon semiconductor was prepared from a $SiH_4$ gas diluted with $H_2$ (concentration of $SiH_4 = 10\%$ by mole). An n-type amorphous silicon semiconductor was prepared from a mixed gas of $SiH_4$, $H_2$ and $PH_3$ ($PH_3/SiH_4 = 0.5\%$ by mole, concentration of $SiH_4 = 6.7\%$ by mole). A p-type amorphous silicon semiconductor was prepared from a mixed gas of $SiH_4$, $H_2$ and $B_2H_6$ of ($B_2H_6/SiH_4 = 0.2\%$ by mole, concentration of $SiH_4 = 8.3\%$ by mole).

The growth rate of the i-layer was 1.8 Å/sec and the dark conductivites of the p-layer and the n-layer were $4 \times 10^{-3}$ $(\Omega \cdot cm)^{-1}$ and $2 \times 10^{-2}$ $(\Omega \cdot cm)^{-1}$ at 20° C., respectively.

According to the above procedures, a solar cell was prepared by depositing, in series, the p-type amorphous silicon semiconductor having a thickness of 135 Å on a surface of a $SnO_2$ thin film (25 $\Omega/\square$) formed on a glass substrate, the i-type amorphous silicon semiconductor having a thickness of 5000 Å and the n-type amorphous silicon semiconductor having a thickness of 500 Å, and then forming a thin film of aluminum (3.3 mm$^2$) on the n-layer by vacuum evaporation. Properties of the solar cell were measured under a solar illumination of 100 mW/cm$^2$ (AM-1 solar simulator). The short circuit current (Jsc), the open circuit voltage (Voc) and the conversion efficiency ($\eta$) of the solar cell were 10.3 mA/cm$^2$, 0.75 V and 4.6%, respectively.

EXAMPLE 1

As a reactor, a reactor of 11 cm in inner diameter made of quartz with a window made of $CaF_2$ was employed. An amorphous silicon semiconductor having the p-i-n structure was prepared by repeating the same procedures as in the Comparative Example except that light was introduced through the window of $CaF_2$ from a low pressure xenon lamp which radiates light having a continuous wavelength in the range of 1500 to 2000 Å. An intensity of the light was adjusted to 50 mW/cm$^2$ at the window.

The growth rate of the i-layer was 7 Å/sec, and the dark conductivities (at 20° C.) of the p-layer and the n-layer were $8 \times 10^{-3}$ $(\Omega \cdot cm)^{-1}$ and $5 \times 10^{-2}$ $(\Omega \cdot cm)^{-1}$, respectively.

The growth rate of the i-layer is increased about 4 times that in the Comparative Example, and also the dark conductivities of the p-layer and the n-layer are improved about 2 times those in the Comparative Example.

The properties of the solar cell having the same structure and thickness as that in the Comparative Example except that the amorphous silicon semiconductor was prepared by the above-mentioned procedures were measured in the same manner as in the Comparative Example. The results were Jsc = 11.9 mA/cm$^2$, Voc = 0.79 V and $\eta = 5.7\%$. The results show the fact that the property of the solar cell is more excellent than that in the Comparative Example by 24%.

EXAMPLE 2

The same procedures as in Example 1 were repeated except that light was introduced through the window from a high pressure xenon lamp to prepare an amorphous silicon semiconductor. Before the incidence on the window, light having a wavelength of more than 5000 Å was filtered off. The intensity of the light was adjusted to 20 mW/cm$^2$ at the window.

The growth rate of the i-layer was 4 Å/sec, which is about 2 times that in the Comparative Example.

EXAMPLE 3

As a reactor, the reactor used in the Comparative Example was used in which a window made of LiF was provided in front of the chamber for photolysis. Through the window, light was introduced from a low pressure krypton lamp which radiates light having a continuous wavelength in the range of 1200 to 1800 Å. The intensity of the light was adjusted to 30 mW/cm at the window.

The same procedures as in the Comparative Example were repeated except that the photolysis was carried out under the above conditions to prepare an amorphous silicon semiconductor.

The growth rate of the i-layer was 10 Å/sec, and the dark conductivities (at 20° C.) of the p-layer and the n-layer were $2.5 \times 10^{-2}$ $(\Omega \cdot cm)^{-1}$ and $7 \times 10^{-2}$ $(\Omega \cdot cm)^{-1}$, respectively. The results show the fact that the growth rate and the doping efficiency are greatly improved.

EXAMPLE 4

As a reactor, the reactor used in Example 1, except that the window was made of LiF, was employed. The same procedures as in Example 1 were repeated except that the source of light used in Example 3 was employed and that SiH$_4$ gas diluted with H$_2$, B$_2$H$_6$ gas and CH$_4$ gas (SiH$_4$:CH$_4$=1:1 by mole, B$_2$H$_6$/(SiH$_4$+CH$_4$)=0.2% by mole) were introduced into the reactor to prepare a p-type amorphous silicon semiconductor.

The dark conductivity of the p-layer was $4 \times 10^{-5}$ $(\Omega \cdot cm)^{-1}$ at 20° C.

In order to confirm the effect of the incidence of the light, a p-layer was prepared by repeating the above-mentioned procedures except that light was not introduced. The dark conductivity of the comparative p-layer was $5 \times 10^{-6}$ $(\Omega \cdot cm)^{-1}$ at 20° C.

What we claim is:

1. An amorphous semiconductor member comprising an amorphous semiconductor material prepared by treating a silicon compound under conditions which will cause the silicon compound to undergo photolysis and plasma decomposition, said process comprising:
    (a) irradiating the silicon compound with light of sufficient wavelength and intensity to decompose the silicon compound; and
    (b) subjecting the silicon compound to conditions of glow discharge.

2. The amorphous semiconductor member of claim 1, wherein an element of Group III or Group V of the Periodic Table is doped.

3. The amorphous semiconductor member of claim 1, wherein the semiconductor is used as a photovoltaic element.

4. The amorphous semiconductor member of claim 3, wherein the photovoltaic element has a p-i-n structure.

5. The amorphous silicon semiconductor member of claim 1, wherein the photolysis is carried out with light having a wavelength of not more than 5000 Å.

6. The amorphous silicon semiconductor of claim 1, wherein the photolysis is carried out with light having an intensity of not less than 20 mW/cm$^2$.

7. The amorphous semiconductor member of claim 1, wherein the plasma decomposition is carried out by high frequency glow discharge.

8. The amorphous semiconductor member of claim 1, wherein said amorphous semiconductor material is amorphous silicon, amorphous silicon carbide, amorphous silicon nitride or an admixture thereof and wherein said silicon compound is used alone or in a mixture which produces said amorphous silicon carbide and amorphous silicon nitride.

* * * * *